United States Patent [19]
Kawakami

[11] Patent Number: 5,320,723
[45] Date of Patent: Jun. 14, 1994

[54] METHOD OF REMOVING SHORT-CIRCUIT PORTION IN PHOTOELECTRIC CONVERSION DEVICE

[75] Inventor: Souichiro Kawakami, Hikone, Japan

[73] Assignee: Canon Kabushiki Kaisha, Tokyo, Japan

[21] Appl. No.: 100,195

[22] Filed: Aug. 2, 1993

Related U.S. Application Data

[63] Continuation of Ser. No. 694,389, May 1, 1991, abandoned.

[30] Foreign Application Priority Data

May 7, 1990 [JP] Japan .................................. 2-115822

[51] Int. Cl.$^5$ ............................................. G01N 27/26
[52] U.S. Cl. ..................................... 204/140; 204/130; 204/141.5; 437/3; 437/4; 324/537; 324/500; 324/501; 324/719
[58] Field of Search ............... 324/537, 500, 501, 719; 437/4, 3; 204/130, 140, 141.5

[56] References Cited

U.S. PATENT DOCUMENTS

| | | | |
|---|---|---|---|
| 4,451,970 | 6/1984 | Izu et al. | 29/574 |
| 4,464,823 | 8/1984 | Izu et al. | 437/4 |
| 4,510,674 | 4/1985 | Izu et al. | 29/574 |
| 4,510,675 | 4/1985 | Izu et al. | 29/574 |
| 4,729,970 | 3/1988 | Nath et al. | 437/225 |
| 4,900,691 | 2/1990 | Jun | 437/3 |
| 5,084,400 | 1/1992 | Nath et al. | 437/4 |

FOREIGN PATENT DOCUMENTS

| | | | |
|---|---|---|---|
| 5994473 | 5/1984 | Japan | H01L 31/04 |
| 6253958 | 3/1987 | Japan | C07C 153/07 |

OTHER PUBLICATIONS

Conf. on Applied Physics, 29p-Z-5 (Autumn, 1986).
*Preprint of Conference of Applied Physics*, "Improvement in the Efficiency of Amorphous Silicon Solar Cells by Electrochemical Processing," Autumn 1986, with English Translation.

Primary Examiner—John Niebling
Assistant Examiner—Bruce F. Bell
Attorney, Agent, or Firm—Fitzpatrick, Cella, Harper & Scinto

[57] ABSTRACT

A method of removing any short-circuit defect existing in a photoelectric conversion device such as solar batteries having a semiconductor layer which is disposed between an upper transparent electrode and a lower electrode and which produces an electromotive force when irradiated with a light. The method comprises applying a voltage between the photoelectric conversion device and a counter electrode across an electrolytic solution containing hydrogen ions and/or hydronium ions. The electrolytic solution is an aqueous solution of an electrolyte or electrolytes selected from a group consisting of inorganic acids, organic acids, inorganic bases, organic bases and salts of metals having standard electrode potential levels which are minus relative to the standard hydrogen electrode potential and which have absolute values greater than hydrogen super voltage.

19 Claims, 9 Drawing Sheets

METHOD OF REMOVING SHORT-CIRCUIT PORTION IN PHOTOELECTRIC CONVERSION DEVICE

This application is a continuation of application Ser. No. 07/694,389 filed May 1, 1991, now abandoned.

BACKGROUND OF THE INVENTION

(1) Field of the Invention

The present invention relates to a method of removing any short-circuit portion in a photoelectric conversion device having a surface layer made of a transparent electrically conductive material.

(2) Related Background Art

Warming of the earth is becoming a matter of great concern as a result of the current increase in carbon dioxide content in the atmospheric air, and this has given a rise to the demand for cleaner energy sources. Nuclear power generation, which still involves the unsolved problem concerning difficulty in disposal of radioactive wastes, is also being demanded to be substituted by cleaner energy sources.

Various clean energy sources are expected to be used in the future, among which solar cells are considered to be promising because of the high degree of cleanness and safety, as well as ease of use. Specifically, studies are being made on amorphous silicon solar cells which may easily be formed as a structure having a large area and which can be produced at low cost. A structure having a large area, however, is impractical as it inevitably suffers from local electric short-circuit, resulting in a lowered product yield.

Japanese Patent Publication No. 62-53958 proposes a method of removing local short-circuit in a photoelectric conversion device such as a solar battery device by applying an energy beam, e.g., a laser beam to the local portion where the short-circuit is taking place. This method, however, is disadvantageous in that it essentially necessitates an operation for locating or determining the portion where the short-circuit is taking place. When short-circuits have taken place in a plurality of portions, laborious work is required in irradiating all these portions with the energy beam.

The specification of U.S. Pat. No. 4,451,970 and Japanese Patent Laid-Open No. 59-94473 proposes a method and a system for removing any short-circuit path in a solar battery device having a semiconductor layer and a conductive light-transmitting layer which are formed on a substrate. According to the proposal, a film is formed from an electrolyte on the conductive light-transmitting layer in the short-circuit area of the device and a voltage is applied such as to maintain a positive potential of the electrolyte film relative to the substrate. These references also show an accumulation of an insulating layer in the area from which the short-circuit current path has been removed. Unfortunately, however, it is impossible to provide the whole electrolyte film with positive charges because the electrolyte film is contacted by both the cathode and anode.

Specifications of U.S. Pat. Nos. 4,510,674 and 4,510,675 propose methods of removing any short-circuit path defect. After determining the portion where the short-circuit is taking place, the transparent conductive oxide is removed at the determined portion by an etchant, followed by deposition of an insulating material on the portion from which the transparent conductive oxide has been removed.

In the method disclosed in U.S. Pat. No. 4,510,674, determination of the portion where short-circuit is taking place is conducted by applying a forward or backward bias voltage to the transparent conductive oxide film and the active region of a solar battery device and detecting the portion at which an electrical current flows. In the method disclosed in U.S. Pat. No. 4,510,675, determination of the portion where short-circuit is taking place is conducted by applying a forward or backward bias voltage to the transparent conductive oxide film and the active region of a solar battery device while applying a light to the device and detecting the portion at which an electrical current flows.

These methods, however, involve the following problems.

(1) A considerably long time is required for the determination of the short-circuit portions particularly when the number of such portions is large.

(2) Application of an etchant tends to cause the non-short-circuit portion of the transparent conductive oxide to be etched, with the result that the performance of the solar battery device is impaired.

U.S. Pat. No. 4,729,970 discloses the following method for discovering any short-circuit path defect occurring in a thin-film type electronic device employing a transparent conductive oxide as an electrode.

An electrical current is supplied to flow between a semiconductor and a counter electrode within a solution containing, as a Lewis acid, salts such as aluminum chloride, zinc chloride, stannic chloride, stannous chloride and titanium tetrachloride. As a result, the transparent conductive oxide is oxidized or reduced so as to change the chemical stoichiometric ratio of the transparent conductive oxide, thereby increasing the resistivity of this film.

This proposed method was tested by employing an aqueous solution of zinc chloride, stannic chloride or stannous chloride, while using the substrate and the counter electrode of the solar battery as a cathode and an anode. The result, however, was quite contrary to what had been expected. Namely, the short-circuit portion was not removed; rather, the leak current due to a short-circuit was undesirably increased as a result of the precipitation of metal-salt formers such as Zn and Sn on the short-circuit portion.

A method for improving efficiency of amorphous silicon (a-Si) solar battery device through electrochemical processing was proposed in 29p-z-5 of Pre-print of Conference of Applied Physics, autumn, 1986. According to this method, a pin-holed portion causing a leak of electrical current in a solar battery of glass/ITO/pin a-Si:H/Al type is repaired by a process including the steps of dissolving the Al of the device in an acid, immersing the sample of the solar battery to be repaired in a dilute sulfuric acid together with platinum, applying a negative potential to the a-Si:H side of the battery so as to electrochemically dissolve ITO (Indium Tin Oxide), and evaporation-depositing Al again so as to complete the battery.

This proposed method for repairing a short-circuit portion, however, can be applied only to solar battery devices of the type in which an ITO layer, an a-Si:H layer as the pin layer and Al layer are sequentially formed on a glass substrate. It cannot be efficiently applied to a photoelectric conversion device of the type having a photoelectric converting semiconductor layer and a transparent conductive layer sequentially formed on a conductive substrate, because of the difficulty encountered in applying a negative potential to the semiconductor layer through the transparent conductive layer which covers the semiconductor layer.

It would be possible to apply a voltage to the semiconductor layer by locally removing the transparent conductive layer by etching. Such a method, however, can produce an effect only in the region around the portion where the voltage is applied. This is particularly so when the photoelectric conversion device has a large area, because the semiconductor layer itself inherently has a large electrical resistivity.

As will be understood from the foregoing description, although various methods have been proposed for eliminating any shunting portion where electric current shunts and short-circuit portions exist in photoelectric conversion devices, all these methods are still unsatisfactory. Namely, the methods relying upon an energy beam require a preparatory work in locating the short-circuit portion and, hence, lower the production efficiency due to impractical long processing time, particularly when short-circuits are taking place in a great number of portions. Practical conditions have not as yet been established for the electrochemical process. Under these circumstances, there is a strong demand for a method for eliminating short-circuit portion which can be applied even to photoelectric conversion devices having a large area and which enables elimination of a short-circuit portion with a high degree of efficiency.

SUMMARY OF THE INVENTION

Accordingly, an object of the present invention is to provide a method of eliminating any short-circuit portion in a photoelectric conversion device of the type having a photoelectric converting semiconductor layer and a transparent conductive layer which are formed in sequence on a conductive substrate, thereby overcoming the above-described problems of the known methods.

Another object of the present invention is to provide a method for eliminating any short-circuit portion or a plurality of short-circuit portions in a short time even when the photoelectric conversion device has a large area and which provides a large yield of the products at a reduced cost.

Still another object of the present invention is to provide a method of removing a short-circuit portion existing in a photoelectric conversion device of the type having a semiconductor layer which is disposed between a lower electrode and an upper transparent electrode and which produces a photo-electromotive force. The method comprises: applying a voltage between the photoelectric conversion device and a counter electrode across an electrolytic solution containing hydrogen ions and/or hydronium ions.

A further object of the present invention is to provide a method of removing a short-circuit portion existing in a photoelectric conversion device of the type having a semiconductor layer which is disposed between a lower electrode and an upper electrode and which generates a photo-electromotive force. The method comprises: applying a voltage between photoelectric conversion devices formed on a flexible substrate and a counter electrode across an electrolyte solution containing hydrogen ions and/or hydronium ions; and feeding the flexible substrate on which the photoelectric conversion devices are formed.

BRIEF DESCRIPTION OF THE DRAWINGS

FIG. 4(a) illustrates the device in the state prior to formation of grid electrodes; FIG. 4(b) illustrates the device in the state after formation of grid electrodes.

FIG. 8(a) illustrates the device in the state prior to formation of grid electrodes; FIG. 8(b) illustrates the device in the state after formation of grid electrodes.

FIG. 11(a) illustrates the device in the state prior to formation of grid electrodes; FIG. 11(b) illustrates the device in the state after formation of grid electrodes.

DESCRIPTION OF THE PREFERRED EMBODIMENT

Figure 1:
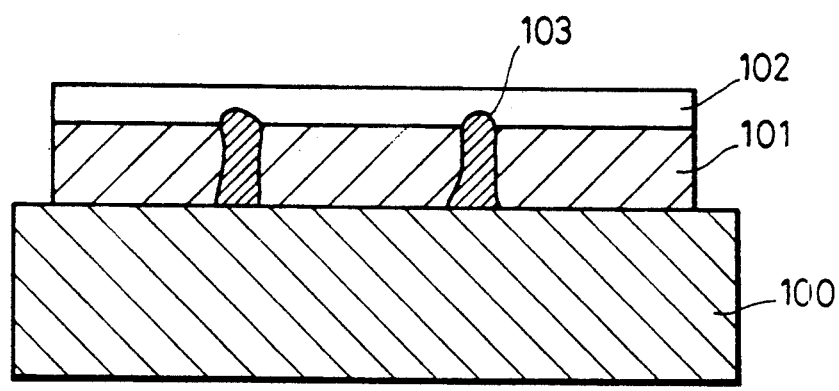
FIG. 1 is a schematic sectional view of a photoelectric conversion device having a short-circuit portion.

The present invention provides a method for eliminating, by an electrochemical process, any defect in a photoelectric conversion device such as a shunt portion where a transparent electrode (upper electrode) and a back electrode (lower electrode) are directly connected and/or short-circuit portion.

A description will now be given of preferred embodiments of the present invention.

Electrolyte

An electrolyte solution containing hydrogen ions and/or hydronium ions is preferably used as the electrolytic solution in the method of the present invention for eliminating a short-circuit portion in a photoelectric conversion device. In order for the electrolytic solution to have hydrogen and/or hydronium ions, the electrolyte solution preferably contains at least one electrolyte selected from a group consisting of acids such as inorganic acids and organic acids, bases such as inorganic bases and organic bases, and salts of metals having standard electrode potentials Eo which are on the minus side relative to standard hydrogen electrode potential $E_HO$, with the absolute value of the standard electrode potential being greater than hydrogen overvoltage.

Although some electrolytes suitable for use in the present invention are shown below, it is to be noted that these electrolytes are only illustrative and not intended for limiting purpose.

Examples of inorganic acids suitably used are hydrochloric acid, nitric acid, hydrofluoric acid and sulfuric acid.

Examples of organic acids suitably used are acetic acid, formic acid, oxalic acid, tartaric acid and benzoic acid.

Examples of inorganic bases suitably used are potassium hydroxide and sodium hydroxide.

Examples of organic bases are amines such as ethylene diamine, aniline and pyridine.

Examples of salts of metals having negative standard electrode potentials the absolute values of which are greater than hydrogen overvoltage are $LiCl$, $KCl$, $NaCl$, $CaCl_2$, $MgCl_2$, $Li_2SO_4$, $KF$, $KBr$, $KI$, $K_2SO_4$, $K_2CO_3$, $K_3PO_4$, $NaBr$, $NaI$, $Na_2SO_4$, $Na_3PO_4$, $CaSO_4$, $MgSO_4$, $BaCl_2$, $CeCl_3$, $Ce_2(SO_4)_3$, $AlCl_3$, $Al_2(SO_4)_3$, $YCl_3$, $Y_2(SO_4)_3$, $ScCl_3$ and $Sc_2(SO_4)_3$.

In order to form an electrolyte solution containing hydrogen ions and/or hydronium ions, it is preferred to use water or a non-aqueous organic solvent such as alcohol or phenol, as the solvent.

When salts of metals other than the metals having negative standard electrode potentials the absolute values of which are greater than hydrogen overvoltage, such as $CuSO_4$, $FeCl_3$ and $ZnCl_2$ are used, the metals, such as Cu, Fe and Zn are precipitated on the short-circuit portion which undesirably increases the leak at the short-circuit portion. This problem also arises when metals such as Cr, Ni, Sn, Pb, Ag and so forth are used in the electrolyte solution.

Preferably, the electrolyte solution is used under such conditions that enable an electrochemical selective removal of short-circuit portions in a photoelectric conversion device. The electrochemical reaction for the removal of the short-circuit portion occurs more easily when the acidity of the electrolyte solution is high. However, the acidity of the electrolyte solution should be determined so as not to cause a vigorous reaction between the upper electrode material and the electrolyte solution to such a degree as to cause etching of the entire area of the electrode merely by a contact between the electrolyte solution and the upper electrode material. Namely, it is necessary to suitably select the material of the electrolyte solution in relation to the electrode material such as to avoid vigorous reaction between the upper electrode and the electrolyte solution and/or to adjust the density and temperature of the electrolyte solution so as to retard the reaction.

For instance, when the material of the upper electrode is ZnO, which is one of transparent conductive oxides, it is necessary to use an electrolyte solution having a low reactivity such as an aqueous solution of LiCl, NaCl, KCl and MgCl, since ZnO exhibits a high reactivity both to acids and bases.

In order to efficiently conduct an electrochemical reaction in the short-circuit portion of the photoelectric conversion device so as to eliminate that short-circuit portion, it is preferred that the electrolyte solution has a comparatively low electrical resistivity. Specifically, the specific conductivity of the electrolyte solution preferably ranges from about 0.001 S/cm to about 10 S/cm, more preferably from about 0.005 to about 5.0 S/cm and most preferably from about 0.05 to about 1.0 S/cm.

The concentration of the electrolyte contained in the electrolyte solution preferably ranges from about $2.0 \times 10^{-4}$ mol/ to about 5.0 mol/l, more preferably from $5.0 \times 10^{-4}$ mol/l to 2.0 mol/l.

It is also preferred that the temperature of the electrolyte solution is set to a level which does not cause much evaporation or boiling solidification of the 1U solution. For instance, when the electrolyte solution is an aqueous solution, the temperature preferably is set to range from about $-10°$ C. to $100°$ C., more preferably from $0°$ C. to $90°$ C.

The temperature of the electrolyte solution can suitably be determined in accordance with factors such as the type of the solvent used and the temperature-dependency of the reaction between the electrolyte solution and the upper electrode.

Photoelectric Conversion device

The photoelectric conversion device has a semiconductor layer which is disposed between a transparent electrode (upper electrode) formed of a light-transmitting material and a back electrode and which generates photoelectromotive force upon receipt of a light incident thereto.

The transparent electrode is composed of a light-transmitting and electrically conductive material which is disposed on the incident side of the photoelectric conversion device. Examples of the material of the transparent electrode are, for example, $In_2O_3$, $SnO_2$, $In_2O_3$—$SnO_2$, ZnO, $TiO_2$ and $Cd_2SnO_4$.

The semiconductor layer can have any suitable construction provided that it can generate photo-electromotive force upon absorption of light. For instance, a semiconductor of Schottky junction type, pin junction type and pin junction type can be suitably used. It is also possible to use a stack-structure type semiconductors, e.g., tandem or triple type, in which a plurality of semiconductors of the above-mentioned junction types are stacked.

As the semiconductor material, it is possible to use a silicon type semiconductor containing hydrogen, germanium, carbon, nitrogen and/or oxygen, a chalcogen-type semiconductor containing Se, Te or the like as the main component, and a compound semiconductor such as $CuInSe_2$, CdS, GaAs, InP and so forth. The state of crystals of such semiconductors may be amorphous, polycrystalline or single-crystal.

The back electrode can be formed of a metallic conductive substrate, or an organic or inorganic material which has been subjected to an electrical conduction surface treatment such as formation of a layer of a conductive material.

Practical examples of the material of the back electrode are substrates of metals such as stainless steel, Ti, Cu, Cr, Al, Mo, W, Ag and Ni and substrates made of polymeric materials such as plastics and glass carrying thin layers of the above-mentioned metals formed thereon.

Counter Electrode

The counter electrode functions as an anode which provides a potential necessary for triggering an electrochemical reaction at the short-circuit portion of the photoelectric conversion device.

Chemically inert substances such as gold, platinum, titanium and so forth can suitably be used as the material of the counter electrode.

Other electrode materials may also be used for forming the counter electrode according to the type of the electrolyte solution.

For instance, when the electrolyte solution is an aqueous solution of sulfuric acid, a lead-silver alloy or a lead-antimony-silver alloy can suitably be used as the material of the counter electrode.

When the electrolyte solution is free of sulfuric acid, strong acid ions and strong alkali ions, graphite is suitably used as the material of the counter electrode.

When the electrolyte solution contains neither an acid nor chloride ions, nickel is suitably used as the material of the counter electrode.

A description will now be given of embodiments of the method of the present invention for eliminating a short-circuit portion in a photoelectric conversion device.

FIG. 1 schematically shows the construction of a photoelectric conversion device having a short-circuit portion. The photoelectric conversion device shown in FIG. 1 has a conductive substrate 100 serving also as a lower electrode, a semiconductor layer 101 which generates photo-electromotive force, a transparent conductive oxide layer 102 forming an upper electrode, and short-circuit portions denoted by 103.

Figure 2:
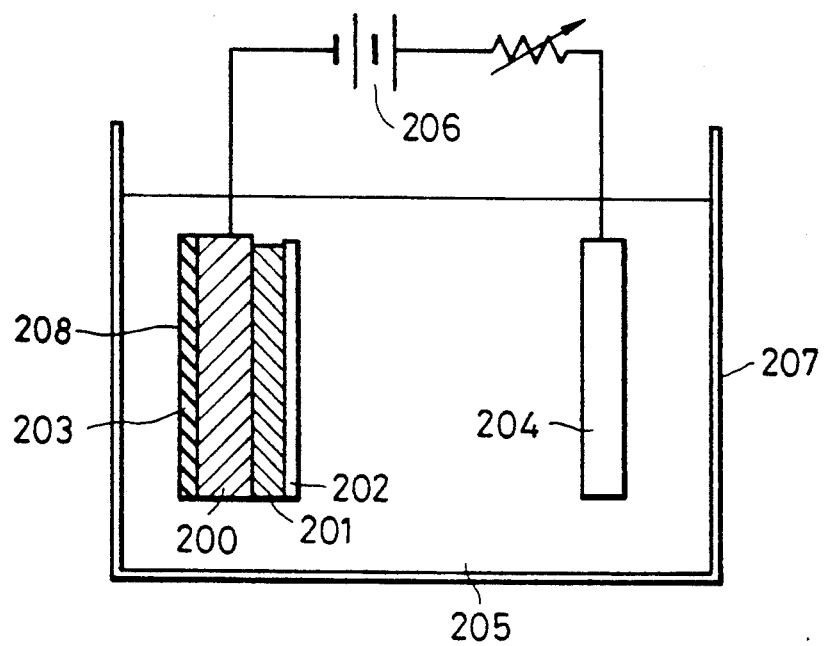
FIG. 2 is a schematic illustration of a processing apparatus suitable for use in carrying out the method of the invention for eliminating a short-circuit portion.

FIG. 2 schematically shows an electro-reducing apparatus which is suitable for conducting an electrochemical reaction for the purpose of elimination of the short-circuit portions 103 (shown in FIG. 1). FIG. 2 also shows a photoelectric conversion device (object to be treated) 208 which is mounted in the electro-reducing apparatus and which has a conductive substrate 200, a semiconductor layer 201, a transparent electrode 202 and an insulating covering layer 203 covering the substrate 200. The apparatus includes an anode 204, an electrolyte solution 205 and a power supply 206 which are accommodated in an electrolyte cell 207.

In the apparatus shown in FIG. 2, when a short-circuit portion exists, an electrical current flows from the conductive substrate 200 of the photoelectric conversion device serving as a cathode so as to impede efficient electrochemical reaction at the short-circuit portion. In order to obviate such a problem, the surface of the conductive substrate 200 is covered by the insulating covering layer 203 made of an insulating material such as acetyl cellulose, rubber magnet, insulating paint or the like.

The operation for eliminating a short-circuit portion is as follows. As the first step, the counter electrode 204 and the photoelectric conversion device as the processing object are immersed in an electrolyte solution filling the electrolyte cell 207. Then, a voltage is applied between the counter electrode 204 as an anode and the conductive substrate 200 as a cathode, such that an electrochemical reaction takes place preferentially at the short-circuit portion. Namely, a voltage is applied by a power supply 206 between the anode 204 and the cathode 200 so that the electrons flow from the power supply to the cathode 200. This current flows preferentially through the short-circuit portion so that an electrochemical reaction takes place in this portion, so that the material of the transparent conductive layer contacting with the electrolyte solution is reduced by hydrogen ions in the short-circuit portion. As a result, the transparent conductive material is dissolved as metal ions into the electrolyte solution. That is, the transparent conductive material is removed at the short-circuit portion.

When indium trioxide-stannic oxide are used, the following reactions are considered to be taking place at the cathode.

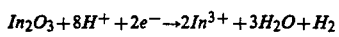

$$In_2O_3 + 8H^+ + 2e^- \rightarrow 2In^{3+} + 3H_2O + H_2$$

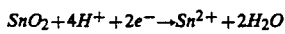

$$SnO_2 + 4H^+ + 2e^- \rightarrow Sn^{2+} + 2H_2O$$

A higher efficiency of electro-reduction for the removal of the transparent conductive oxide from the short-circuit portion is obtained when the reduction is conducted in advance of formation of grid electrodes for collecting electric power on the photoelectric conversion device.

The electro-reducing apparatus shown in FIG. 2 is of the type in which the photoelectric conversion device as the processing object is immersed in an electrolyte solution. This, however, is only illustrative, and the method of the present invention can be carried out with an apparatus of the type in which, as will be explained below in connection with FIG. 3, the photoelectric conversion device is not immersed in an electrolyte solution.

Figure 3:
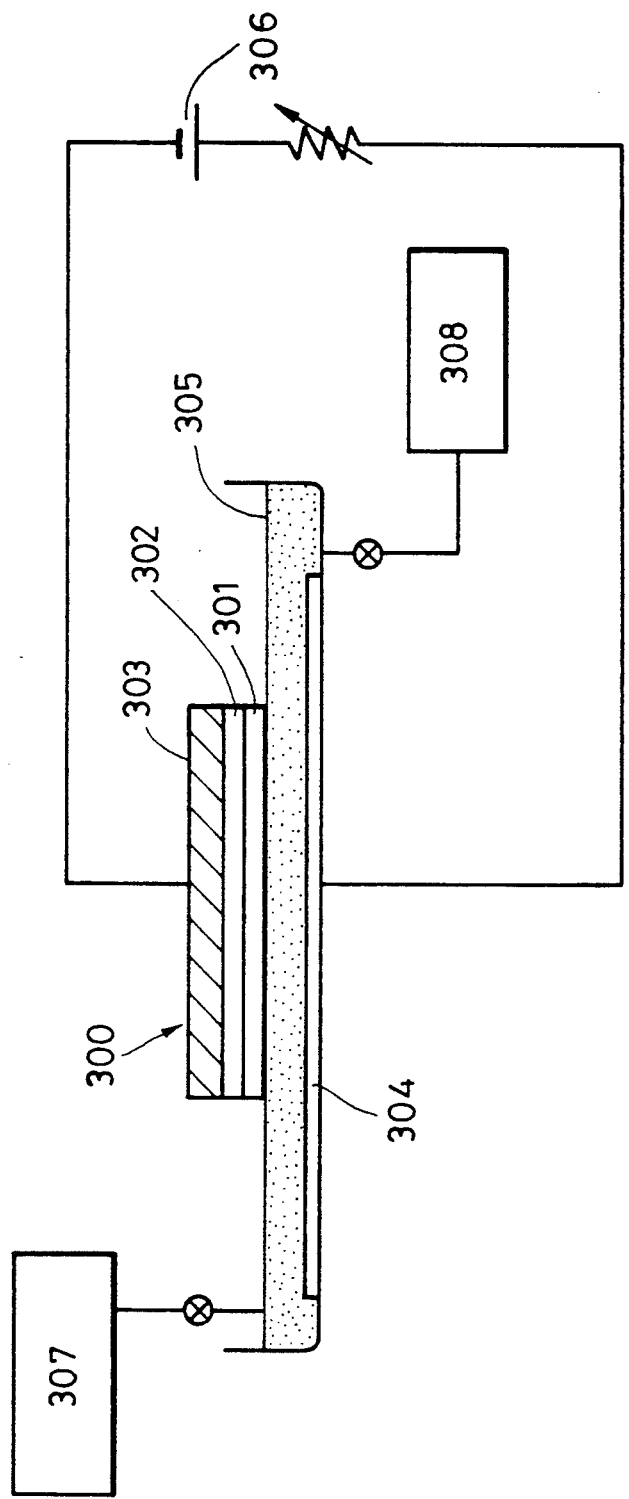
FIG. 3 is a schematic illustration of another processing apparatus suitable for use in carrying out the method of the invention for eliminating a short-circuit portion.

Referring to FIG. 3, a photoelectric conversion device 300 as the processing object has a transparent electrode (upper electrode) 301, a semiconductor layer 302 and a back electrode 303. The electro-reducing apparatus of FIG. 3 has an electrolyte retention member 305 which is impregnated with an electrolyte solution and which is held in contact with the upper electrode 301. The apparatus also has a power supply 306 and a counter electrode 304. In order to remove any short-circuit portion of the photoelectric conversion device 300, a voltage is applied between the photoelectric conversion device 300 and the counter electrode 304.

Any material which does not react with the electrolyte solution and which can retain the electrolyte solution may be used as the material of the electrolyte retention member 305. For instance, a porous material such as a sponge, an organic polymeric material such as polyester fiber, nylon fiber or cellulose fiber, and an inorganic material such as ceramics whisker or asbestos may be used as the material of the electrolyte retention member.

The electro-reducing apparatus can have an electrolyte supply means 307 for supplying the electrolyte retention member 305 with an electrolyte solution, as shown in FIG. 3. It is also possible to provide an electrolyte discharge means for discharging an electrolyte from the electrolyte retention member 305. Pressurizing and depressurizing means such as pumps may be provided as required in the electrolyte supply means 307 and the discharge means 308.

The apparatus shown in FIG. 3 makes it possible to efficiently remove any short-circuit portion without requiring a covering layer which is used in the apparatus of FIG. 2 for the purpose of covering the back electrode. In addition, the temperature of the electrolyte can be controlled easily because the quantity of the electrolyte used in the apparatus is small. Furthermore, contamination of the electrolyte solution is suppressed by virtue of the circulation of the electrolyte solution.

In order to successfully carry out the method of the invention for removing short-circuit portion in photoelectric conversion device, it is preferred that the voltage applied between the counter electrode serving as an anode contacting with electrolyte solution and the photoelectric conversion device as a cathode is determined to be not lower than the hydrogen generating potential which is the potential at which the generation of hydrogen due to electrolysis of the electrolyte solution begins and which is calculated by using an electrode potential defined by Nerst's equation.

When the electrolyte solution is an aqueous solution, the voltage applied is preferably not lower than 1.23V which is the stoichiometric decomposition potential of water under the standard condition of 25° C. at 1 atm. Application of too high a voltage, however, tends to cause side reactions at portions other than the short-circuit portion to be treated. According to the invention, therefore, the voltage applied between both electrodes is preferably determined to be no lower than about 1.23 V and no greater than about 10.0 V.

Considering any loss of electrical power caused by resistances of the electrodes and the solution and also any over-voltage, as well as inevitable unevenness of the electrochemical reaction under application of high voltage, the voltage applied between both electrodes is preferably determined to be not less than about 2.0 V and not greater than about 5.0 V. Actually, the hydrogen generating potential in an electrolyte solution varies according to various factors such as the materials of the electrodes and the composition of the electrolyte solution. It is therefore suggested that a suitable voltage level is selected within the above-mentioned range.

The voltage applied between both electrodes may be kept constant throughout the period of the electro-reducing operation or it may be varied to avoid any side reaction. When the level of the voltage is changed during the reducing operation, the voltage may be applied in the form of a pulse train or trains of saw-tooth or mountain-shaped waveforms.

The density of the electric current flowing through the photoelectric conversion device as the treating object is preferably selected to range between the minimum level which can cause the main reaction, i.e., electro-reducing reaction triggered by hydrogen ions, and the maximum level which does not cause any side reaction.

Experience has taught that the electric current density in the photoelectric conversion device is preferably not less than about 0.1 mA/cm$^2$ and not greater than about 1 A/cm$^2$, more preferably not less than about 1.0 mA/cm$^2$ and not greater than about 100 mA/cm$^2$.

The length of time for the electro-reducing reaction should be determined to be long enough to remove the transparent electrode material at the shunt and short-circuit portions. However, if the voltage is maintained so as to continue the supply of electric current even after the removal of the transparent electrode material at the shunt and short-circuit portion, side reactions may undesirably occur at portions other than short-circuit portions. It is not recommended to extend the treating time unnecessarily.

Based on the experiences of the inventors, the length of time length for the electro-reducing treatment is preferably not less than about 0.5 seconds and not longer than about 300 seconds, more preferably not shorter than 1 second but not longer than 120 seconds.

The invention will be more fully understood from the following description of Examples. It is to be noted, however, that these Examples are only for illustrative purpose and are not intended for limiting the scope of the invention.

EXAMPLE 1

Figure 4A:
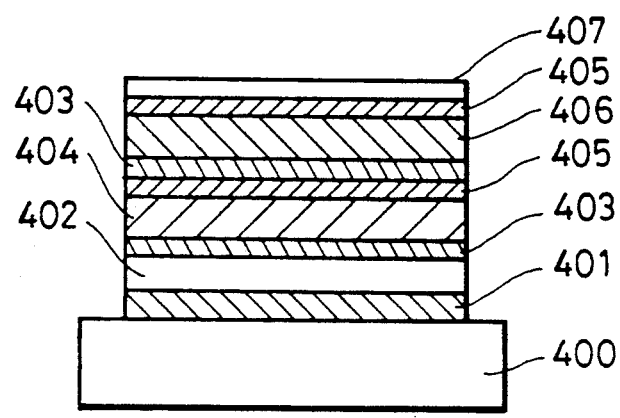
FIGS. 4(a) and 4(b) are schematic illustrations of a photoelectric device.
Figure 4B:
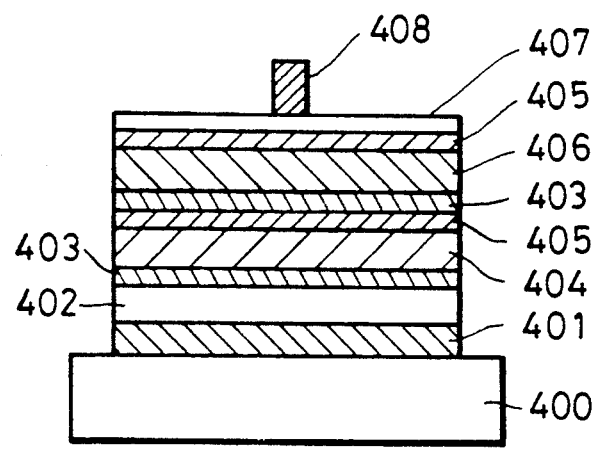

Twelve blanks of photoelectric conversion devices of the type shown in FIG. 4(a) with short circuit defects were treated by the method of the present invention for the removal of short-circuit portions, and grid electrodes were formed on the treated blanks so that photoelectric conversion devices shown in FIG. 4(b) were obtained. Twelve photoelectric conversion devices of the type shown in FIG. 4(b) also were produced by forming grid electrodes on the blanks shown in FIG. 4(a), without subjecting these blanks to the treatment for removing short-circuit portions. The thus obtained samples of photoelectric conversion devices were compared to enable evaluation of the effect of the invention for removing short-circuit portions.

Each of the blanks shown in FIG. 4(a) and, hence, each of the photoelectric conversion devices shown in FIG. 4(b) had a metal substrate 400 of 5 cm wide and 5 cm long, made of a stainless steel, a back electrode 401 made of silver, a zinc oxide layer 402 for preventing diffusion of silver, an n-type amorphous silicon layer 403 doped with phosphor, a non-doped (i type) amorphous silicon germanium layer 404, a p-type amorphous silicon layer 405 doped with boron, a non-doped amorphous silicon layer 406, a transparent conductive oxide layer 407 of stannic oxide, and a grid electrode 408 of Cr/Ag/Cr.

The treatment for removing short-circuit portions was conducted in the following manner.

The surface of the metal substrate 400 of the blank shown in FIG. 4(a) was coated with acetyl cellulose film 203 (as shown in FIG. 2). Then, an electro-reduction for removing short-circuit portions was conducted on the blank of the photoelectric conversion device as a cathode, by using the electro-reducing apparatus shown in FIG. 2. The conditions of the electro-reduction were as follows.

| | |
|---|---|
| Counter electrode | platinum plate (5 cm square) |
| Electrolyte solution | |
| Composition | 2 mol/l hydrochloric acid aqueous solution |
| temperature | 25° C. |
| specific electric conductivity | 0.6 S/cm |
| Voltage applied | 3.0 V (Constant) |
| Current density | 50 mA/cm$^2$ |
| Current supply time | 30 seconds |

After the application of the voltage, the photoelectric conversion device was rinsed with water and then with alcohol, followed by drying with air at 100° C.

Figure 5:
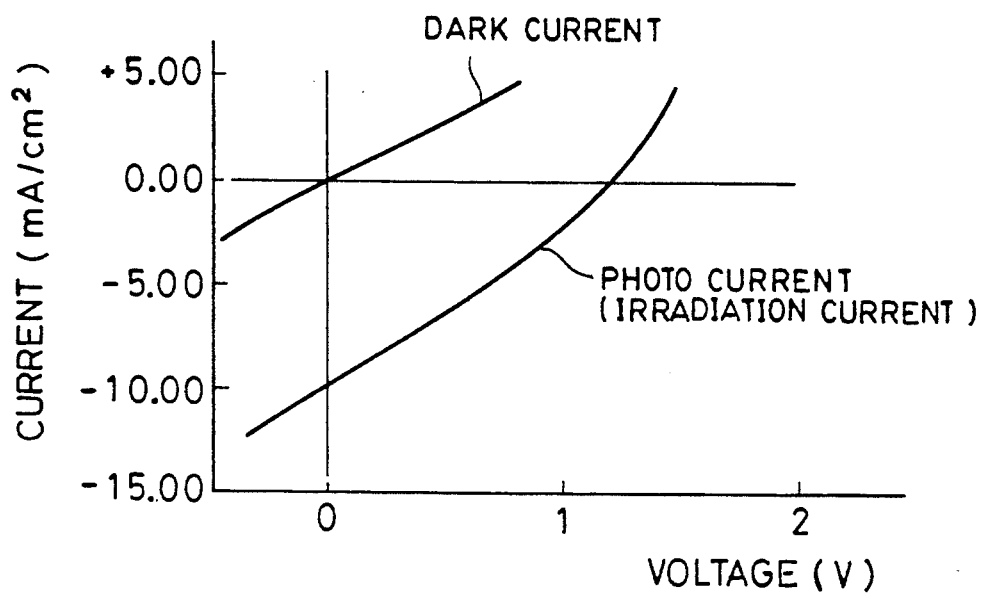
FIG. 5 is a chart showing current-voltage characteristics of a photoelectric conversion device.
Figure 6:
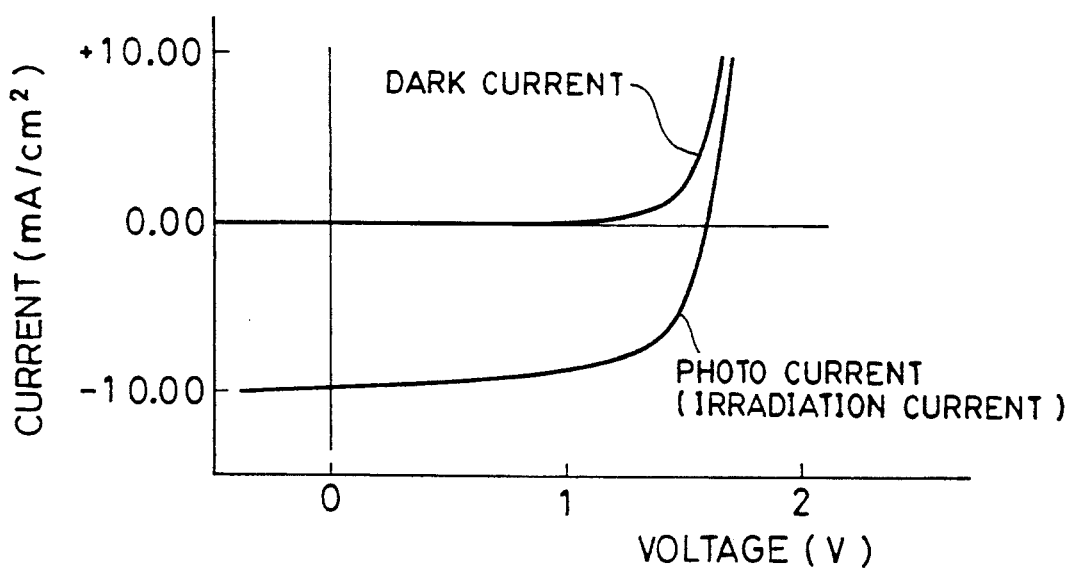
FIG. 6 is a chart showing current-voltage characteristics of a photoelectric conversion device.

FIG. 5 shows the representative values of current-voltage (I-V) characteristics of the photoelectric conversion devices before the electro-reducing treatment as measured under light irradiation of AM 1.5 and 100 mW/cm$^2$. These values were obtained by measuring the characteristics of photoelectric conversion devices obtained by forming grid electrodes on the blanks without subjecting the blanks to the electro-reducing treatment. FIG. 6 shows the representative values as measured on the photoelectric conversion devices which have been subjected to the electro-reduction for removing short-circuit portion. Mean values of the open voltage (Voc), short-circuit current (Isc), fill factor (FF), photoelectric conversion efficiency, shunt resistance (Rsh) and series resistance (Rs) are shown in Table 1.

TABLE 1

| Characteristics of photoelectric conversion device | | |
|---|---|---|
| | Not treated | Treated |
| Voc(V) | 1.2 | 1.6 |
| Isc(mA/cm$^2$) | 9.8 | 9.7 |
| FF | 0.28 | 0.63 |
| Eff(%) | 3.3 | 9.8 |
| Rsh($\Omega \cdot$ cm$^2$) | 1.4 × 10$^2$ | 1.3 × 10$^3$ |
| Rs($\Omega \cdot$ cm$^2$) | 8.4 × 10$^1$ | 1.5 × 10$^1$ |

Figure 7:
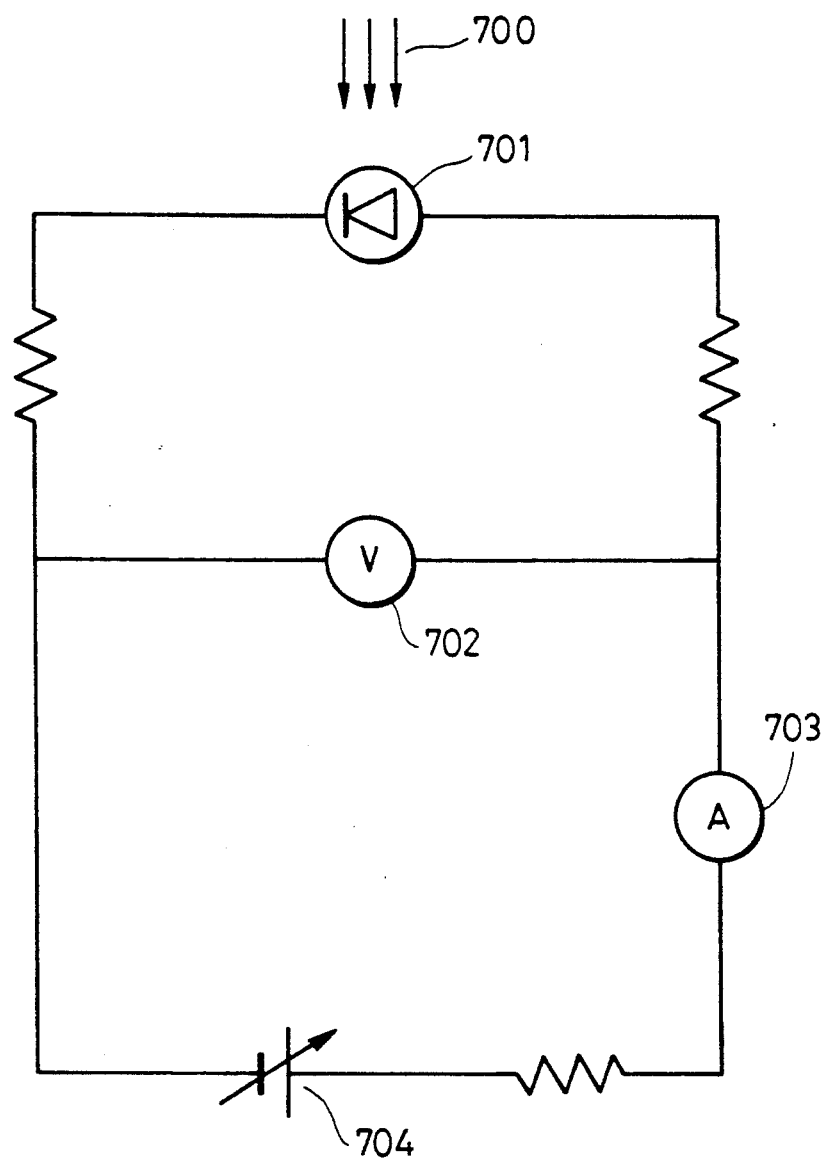
FIG. 7 is an illustration of a circuit for measuring the current-voltage characteristic.

The measurement of the current-voltage (I-V) characteristics was conducted by using a measuring circuit as shown in FIG. 7. In FIG. 7, numeral 701 denotes a photoelectric conversion device, 702 denotes a volt meter, 703 denotes an ammeter and 704 denotes a D.C. power supply. The circuit was arranged such that the photoelectric conversion device 701 was irradiated with light 700.

As will be seen from I-V characteristics shown in FIGS. 5 and 6, as well as the measured values shown in Table 1, a remarkable improvement in the I-V characteristic was achieved by the treatment, i.e., the method of removing short-circuit portions of the present invention. Furthermore, the photoelectric conversion efficiency (Eff) and the shunt resistance (Rsh) were remarkably improved, proving the superior effect of removal of short-circuit portions.

In Example 1, electro-reducing of the transparent conductive material could be effected very efficiently at the short-circuit portions, thus eliminating problems encountered with known methods for removing short-circuit portions in photoelectric conversion devices. In particular, transparent conductive material could be efficiently dissolved and removed at short-circuit portions. It was also confirmed that the method of the present invention is effective and reliable, particularly when it is applied to removal of a large number of short-circuit defects in photoelectric conversion devices having large areas. In addition, the treating process could be carried out with a small number of steps by using a simple apparatus, thus offering a high yield and a marked reduction in the production cost.

EXAMPLE 2

Figure 8A:
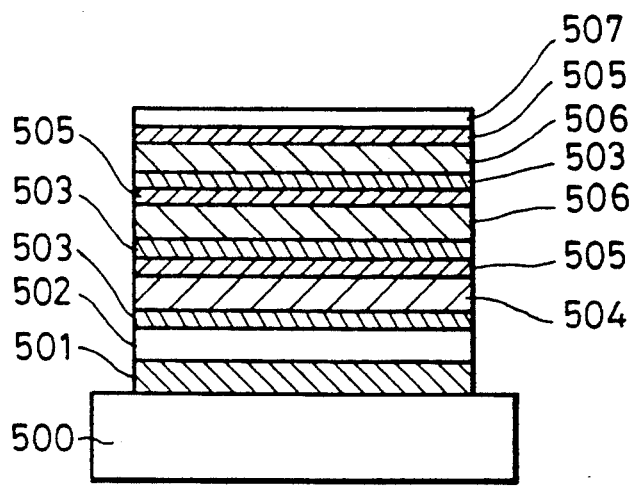
FIGS. 8(a) and 8(b) are schematic illustrations of a photoelectric conversion device.
Figure 8B:
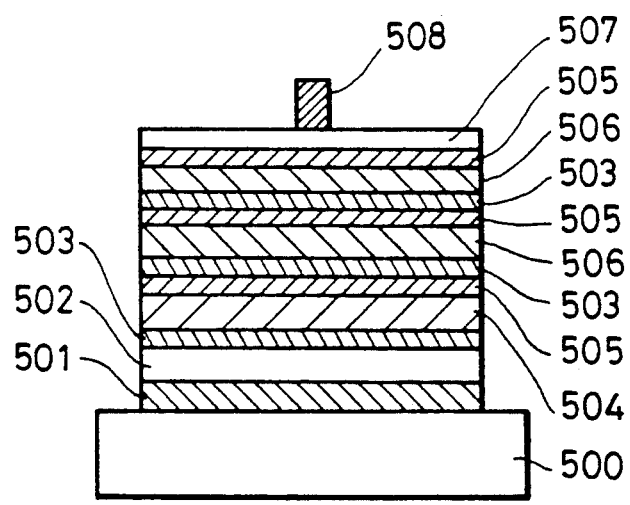

A treatment for removal of short-circuit portions in accordance with the present invention was conducted on blanks of photoelectric conversion devices of the type shown in FIG. 8(a), and grid electrodes were formed on the thus treated blanks so that photoelectric conversion in FIG. 8(b) were obtained.

The photoelectric conversion device shown in FIG. 8(b) is a so-called triple-type photoelectric conversion device having a stainless steel substrate 500 of 5 cm wide and 6 cm long, an Ag electrode 501, a ZnO layer 502, an n-type amorphous silicon layer 503 doped with phosphor, a non-doped amorphous silicon/germanium layer 504, a p+type amorphous silicon layer 505, a non-doped amorphous silicon layer 506, an In$_2$O$_3$-SnO$_2$ transparent electrode layer 507, and a Cr/Ag/Cr grid electrode 508.

As in the case of Example 1, the blanks shown in FIG. 8(a) were subjected to an electro-reducing operation which was conducted using the electro-reducing apparatus shown in FIG. 2 for the purpose of removing short-circuit portions. The conditions of the electro-reduction were as follows.

| Counter electrode | Graphite (6 cm square) |
|---|---|
| Electrolyte solution | |
| Composition | 0.05 mol/l MgCl$_2$ aqueous solution |
| temperature | 50° C. |
| specific electric conductivity | 0.01 S/cm |
| Voltage applied | 4.0 V (Constant) |
| Current density | 10 mA/cm$^2$ |
| Current supply time | 1 minute |

After the application of the voltage, the photoelectric conversion device was rinsed as in Example 1 and I-V and the characteristics were measured.

Figure 9:
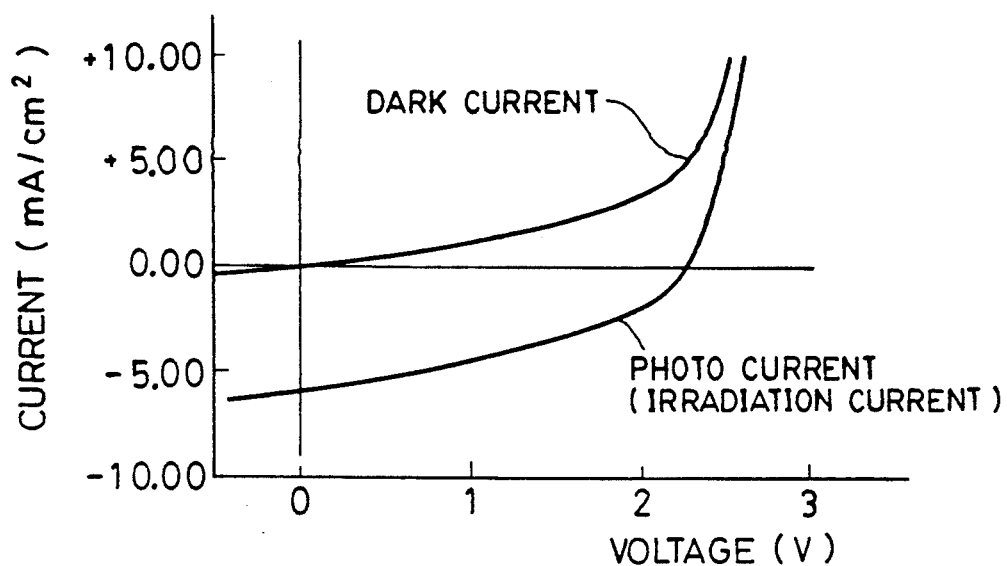
FIG. 9 is a chart showing current-voltage characteristics of a photoelectric conversion device.
Figure 10:
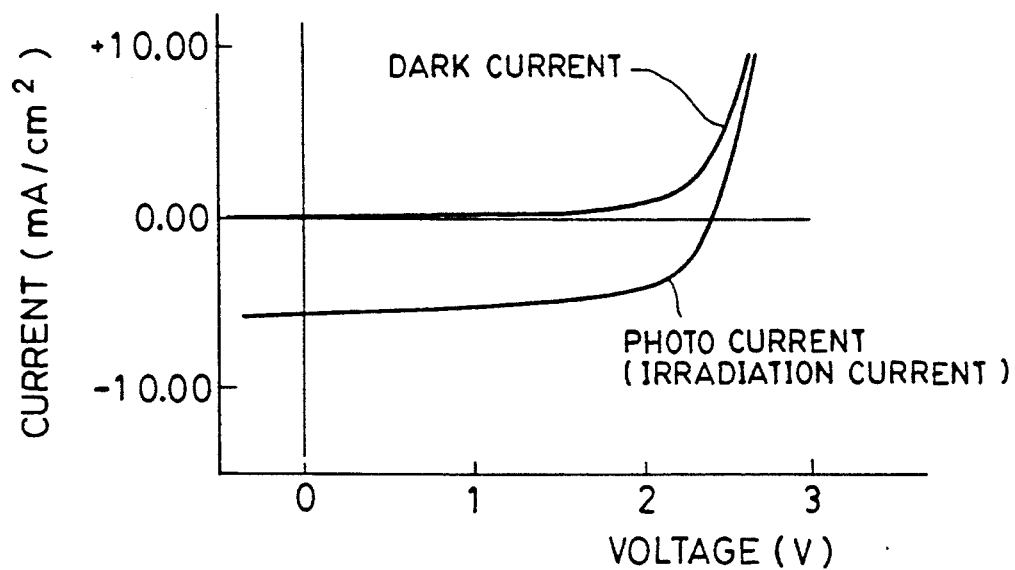
FIG. 10 is a chart showing current-voltage characteristics of a photoelectric conversion device.

FIG. 9 shows the representative values of current-voltage (I-V) characteristics of the photoelectric conversion device which has not been subjected to the electro-reduction, while FIG. 10 shows the representative values as measured on the photoelectric conversion device which has been subjected to the electro-reduction for removing short-circuit portions. Mean values of various characteristics of the photoelectric conversion devices are shown in Table 2.

TABLE 2

| Characteristics of photoelectric conversion device | | |
|---|---|---|
| | Not treated | Treated |
| Voc(V) | 2.3 | 2.4 |
| Isc(mA/cm$^2$) | 5.8 | 5.6 |
| FF | 0.38 | 0.59 |
| Eff(%) | 5.1 | 8.0 |
| Rsh($\Omega \cdot$ cm$^2$) | 9.2 × 10$^2$ | 2.4 × 10$^3$ |
| Rs($\Omega \cdot$ cm$^2$) | 7.5 × 10$^1$ | 4.3 × 10$^1$ |

The measurement of the current-voltage (I-V) characteristic was conducted by using a measuring circuit as shown in FIG. 7. In FIG. 7, numeral 701 denotes a photoelectric conversion device, 702 denotes a volt meter, 703 denotes an ammeter and 704 denotes a D.C. power supply. The circuit was arranged such that the photoelectric conversion device 701 was irradiated with light.

As will be seen from I-V characteristics shown in FIGS. 9 and 10, as well as the measured values shown in Table 2, a remarkable improvement in the I-V characteristic was achieved by the treatment, i.e., the method of removing short-circuit portions of the present invention. Furthermore, the photoelectric conversion efficiency (Eff), the shunt resistance (Rsh) and fill factor (FF) were remarkably improved, proving the superior effect of the removal of short-circuit portions.

COMPARISON EXAMPLE 1

Electro-reduction was conducted on the same blanks as Example 1, using an electrolyte solution containing ZnCl$_2$ which has a standard electrode potential which is 0V or below and the absolute value of which is smaller than the hydrogen overvoltage. The current density and the solution temperature were the same as those in Example 1.

The conditions of the electro-reduction were as follows:

| Counter electrode | Platinum plate (5 cm square) |
|---|---|
| Electrolyte solution | |
| Composition | 1 mol/l ZnCl$_2$ aqueous solution |
| temperature | 25° C. |
| specific electric conductivity | 0.1 S/cm |

-continued

| | |
|---|---|
| Voltage applied | 3.0 V (Constant) |
| Current density | 50 mA/cm² |
| Current supply time | 30 seconds |

The shunt resistances (Rsh) and photoelectric conversion efficiencies (Eff) were measured on the samples which had been subjected to the short-circuit portion removing electrolytic reducing treatment and samples which were not subjected to this treatment. As will be seen from Table 3, the characteristics were degraded as a result of the treatment.

TABLE 3

| Characteristics of photoelectric conversion device | | |
|---|---|---|
| | Not treated | Treated |
| Shunt resistance Rsh($\Omega \cdot cm^2$) | $5.2 \times 10^2$ | $1.1 \times 10^2$ |
| Conversion efficiency EFF(%) | 4.9 | 2.3 |

The surface of the transparent electrode (upper electrode) was observed through an optical microscope and also examined by X-ray microanalysis (XMA). It was confirmed that grains of metal Zn were precipitated on the short-circuit portions.

EXAMPLE 3

Figure 11A:
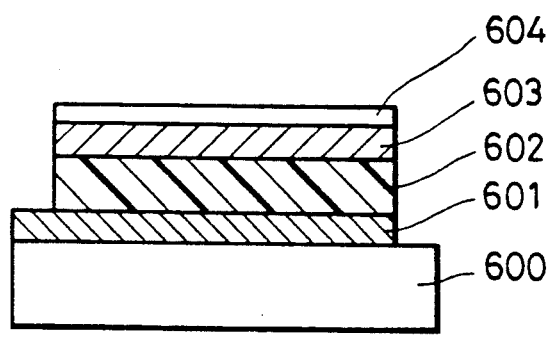
FIGS. 11(a) and 11(b) are schematic illustrations of a photoelectric conversion device.

Electro-reducing operation for removing short-circuit portions was conducted in accordance with the invention on samples of blank of photoelectric conversion devices shown in FIG. 11(a), using the electro-reducing apparatus of FIG. 2. Then, grid electrodes 605 were formed to so as to complete photoelectric conversion device shown in FIG. 11(b).

Figure 11B:
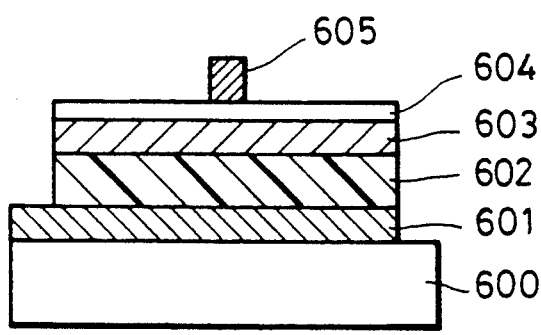

The photoelectric conversion device shown in FIG. 11(b) had a glass substrate (produced by Corning, #7059) 600, a back electrode 601 made of Mo, a CuInSe₂ layer 602, a CdS layer 603, a ZnO layer 604 and a grid electrode 605 of Cr/Ag/Cr.

The photoelectric conversion devices were coated with an acrylic resin and were subjected to an electrolyte reducing operation conducted under the following conditions using the back electrode 601 as an electrical contact.

| | |
|---|---|
| Counter electrode | Platinum plate (5 cm wide and 6 cm long) |
| Electrolyte solution | |
| Composition | 0.02 mol/l Al₂(SO₄)₃ aqueous solution |
| temperature | 25° C. |
| specific electric conductivity | 0.01 S/cm |
| Voltage applied | 2.5 V (Constant) |
| Current density | 5 mA/cm² |
| Current supply time | 2 minutes |

The treated photoelectric conversion device was rinsed and dried in the same manner as Example 1, and were subjected to measurement of the I-V characteristics, shunt resistance (Rsh) and photoelectric conversion efficiency (Eff) under light irradiation at AM 1.5 and 100 mW/cm². The same measurements were also conducted on the photoelectric conversion device which was not subjected to the electro-reduction for removing short-circuit portions. As a result, the photoelectric conversion device which had been treated by the electro-reduction had superior characteristic in all measured items. The shunt resistances (Rsh) and the photoelectric conversion efficiencies of the devices which was treated by the electro-reduction in accordance with the invention and the device which was not treated are shown in the following Table 4.

TABLE 4

| Characteristics of photoelectric conversion device | | |
|---|---|---|
| | Not treated | Treated |
| Shunt resistance Rsh($\Omega \cdot cm^2$) | $8.0 \times 10^2$ | $3.3 \times 10^3$ |
| Conversion efficiency Eff(%) | 5.1 | 7.4 |

EXAMPLES 4 to 18

Electro-reducing treatment was conducted in the same manner as Example 1 except that SnO₂ was used as the material of the transparent electrode (upper electrode). The conditions of this treatment are shown below.

| | |
|---|---|
| Counter electrode | Platinum plate (5 cm square) |
| Electrolyte solution | |
| temperature | 25° C. |
| specific electric conductivity | 0.01 S/cm |
| Voltage applied | 4.0 V (Constant) |
| Current density | 20 mA/cm² |
| Current supply time | 2 minutes |

Ratios Rsh(B)/Rsh(A) between the shunt resistance Rsh(B) measured on samples which were subjected to the electro-reducing treatment and that Rsh(A) of the samples which were not subjected to this treatment were determined as an index for evaluation of the effect of the treatment for removing short-circuit portions. The values of the above-mentioned ratio and the compositions of electrolytes in the reducing electrolyte aqueous solutions are shown in Table 5.

As will be seen from Table 5, the shunt resistance was greatly increased proving the superior effect of the invention for removing short-circuit portions in the photoelectric conversion devices.

TABLE 5

| Results of evaluation of Examples | | |
|---|---|---|
| | Electrolyte (aqueous solution) | Rsh(B)/Rsh(A) |
| 4 | NaOH | 5 |
| 5 | KCl | 7 |
| 6 | NaCl | 7 |
| 7 | H₂SO₄ | 10 |
| 8 | AlCl₃ | 8 |
| 9 | AlF₃ | 5 |
| 10 | AlNH₄(SO₄)₂ | 8 |
| 11 | Al(NO₃)₃ | 9 |
| 12 | Al₂(SO₄)₃ | 10 |
| 13 | TiCl₃ | 9 |
| 14 | TiCl₄ | 10 |
| 15 | CaCl₂ | 7 |
| 16 | Acetic acid | 8 |
| 17 | HF | 10 |
| 18 | Oxalic acid | 8 |

EXAMPLE 19

Figure 12:
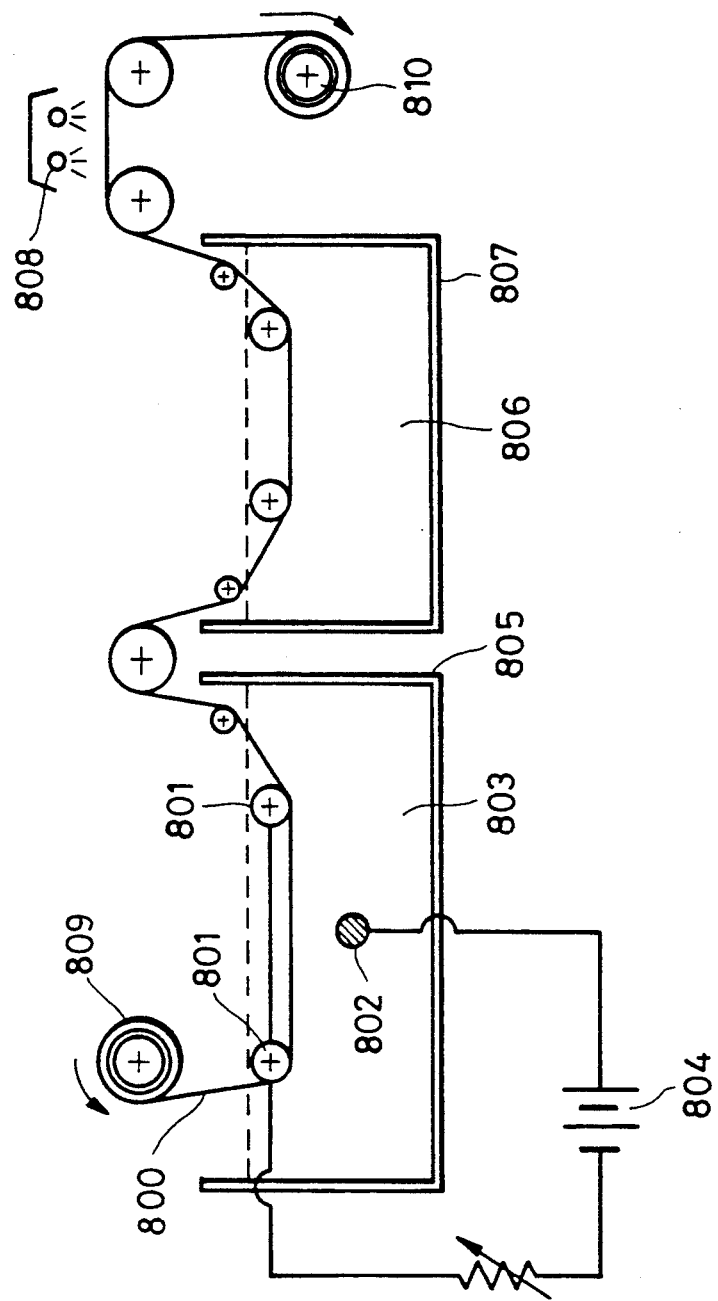
FIG. 12 is a schematic illustration of a processing apparatus suitable for use in carrying out the method of the present invention for eliminating any short-circuit portion in a photoelectric conversion device.

One hundred patterns of photoelectric conversion devices having the construction shown in FIG. 4(a) were formed on a stainless steel film substrate (flexible corrosion-resistant steel film) of 0.2 mm thick, 0.3 m wide and 10 m long. The substrate carrying these patterns were subjected to an electro-reducing treatment conducted by an electro-reducing apparatus shown in FIG. 12 for removing short-circuit portions. In FIG. 12, the substrate is denoted by 800. The electro-reducing apparatus has a cathode electrode 801 which is electrically connected to the stainless steel film substrate and which serves also as a flexible film feed roller, an anode electrode 802, a D.C. power supply 804, an electrolytic cell 805 containing an electrolyte solution 803, a rinsing tank 807 containing a rinsing agent 806, an infrared dryer lamp 808, a roll-type photoelectric conversion device 809 and a take-up roller 810.

In this Example, a stainless steel film, also serving as a flexible film, was used as the substrate, while $SnO_2$ was used as the material of the transparent electrode.

The conditions of the electro-reducing treatment were as follows.

| Anode (Counter electrode) | Pb—Sb—Ag alloy |
|---|---|
| Electrolyte solution | |
| Composition | 0.5 mol/l $H_2SO_4$ aqueous solution |
| Temperature | 25° C. |
| Specific conductivity | 0.2 S/cm |
| Voltage applied | 3.5 V |

The I-V characteristics of the 100 pieces of photoelectric conversion devices were measured in the same manner as Example 1. The levels of shunt resistance of the 100 pieces of photoelectric conversion devices were also measured, and the proportion of the devices which showed shunt resistance levels below $1.0 \cdot 10^3$ Ω·cm was determined as the short-circuit ratio. As a result, it was confirmed that I-V characteristics have been improved by virtue of the electro-reducing treatment. The short-circuit ratio measured for the devices which were not subjected to the electro-reducing treatment was as large as 54% but was reduced to 0% as a result of the electro-reducing treatment.

As will be understood from the result of evaluation of Example 19, the method of the present invention for removing short-circuit portions is suitable for repairing a photoelectric conversion device of a large area having a large number of short-circuit portions. In addition, the process could be easily carried out by a simple treating apparatus. It was thus confirmed that the method of the present invention enables production of photoelectric conversion devices of large areas at low production costs.

EXAMPLE 20

Example 20 was executed substantially in the same manner as Example 1.

Ten blanks of photoelectric conversion devices of the type shown in FIG. 4(a) with short circuit defects were treated by the method of the present invention for the removal of short-circuit portions, and grid electrodes were formed on the treated blanks so that photoelectric conversion devices shown in FIG. 4(b) were obtained. Ten photoelectric conversion devices of the type shown in FIG. 4(b) also were produced by forming grid electrodes on the blanks shown in FIG. 4(a), without subjecting these blanks to the treatment for removing short-circuit portions. The thus obtained samples of photoelectric conversion devices were compared to enable evaluation of the effect of the invention for removing short-circuit potions.

Each of the blanks shown in FIG. 4(a) and, hence, each of the photoelectric conversion devices shown in FIG. 4(b) had a metal substrate 400 made of a stainless steel, a back electrode 401 made of silver, a zinc oxide layer 402 for preventing diffusion of silver, an n-type amorphous silicon layer 403 doped with phosphor, a non-doped (i type) amorphous silicon germanium layer 404, a p-type amorphous silicon layer 405 doped with boron, a non-doped amorphous silicon layer 406, a transparent conductive oxide layer 407 of tin oxide, and a grid electrode 408 of Cr/Ag/Cr.

As in the case of Example 1, the surface of the metal substrate 400 of the blank shown in FIG. 4(a) was coated with acetyl cellulose film 203. Then, an electro-reducing treatment for removing short-circuit portions was conducted on the blank of the photoelectric conversion device. The electro-reducing treatment was conducted by using the electro-reducing apparatus shown in FIG. 2 and an aqueous solution of nitric acid having a specific conductivity of 0.5 s/cm as the electrolyte solution. The treatment was executed by applying a D.C. voltage of 3.0 V between a platinum plate as a counter electrode serving as an anode and the conductive substrates 400 of the blanks as cathodes so as to cause an electrical current to flow at a current density of 20 $mA/cm^2$ per cathode to effect an electrochemical reaction which was maintained for 30 seconds. After the treating voltage was stopped, the photoelectric conversion devices were rinsed with water and then by alcohol, followed by drying at 100° C.

The I-V characteristics, as well as characteristics such as photoelectric conversion efficiency (Eff), fill factor (FF), shunt resistance (Rsh) and series resistance (Rs)were measured on the sample photoelectric conversion devices of FIG. 4, in the same manner as Example 1.

It was confirmed that the photoelectric conversion devices which have been treated in accordance with the present invention showed much improved characteristics, thus proving the effect of the present invention for removing short-circuit portions.

What is claimed is:

1. A method for removing a short-circuit portion in a photoelectric conversion device producing a photoelectromotive force comprising the steps of:
   (i) forming a semiconductor layer, between a lower electrode and an upper electrode said semiconductor layer generating photoelectromotive force upon absorption of light;
   (ii) preparing an electrolyte solution and immersing said photoelectric conversion device in said electrolyte solution, said electrolyte solution comprising hydrogen ions or hydronium ions or hydrogen ions and hydronium ions and having a specific electric conductivity in the range of 0.001 S/cm to 10 S/cm which causes an electrochemical reaction which selectively removes said short circuit portion;
   (iii) immersing a counter electrode across from said photoelectric conversion device said electrolyte solution; and
   (iv) applying a voltage between said photoelectric conversion device and said counter electrode such that the lower electrode of the photoelectric conversion device serves as a cathode, thereby causing solution of the short-circuit portion into said electolyte solution.

2. A method according to claim 1, wherein said electrolyte solution contains at least on electrolyte selected from a group consisting of an inorganic acid, an organic acid, an inorganic base, an organic base and a salt of a metal having a standard electrode potential level which is minus relative to the standard hydrogen electrode potential and which has an absolute value greater than hydrogen over voltage.

3. A method according to claim 1, wherein the concentration of the electrolyte in said electrolyte solution is from $2\times10^{-4}$ mol/l to 5.0mol/l.

4. A method according to claim 2, wherein the concentration of the electrolyte in said electrolyte solution is from $2\times10^{-4}$ mol/l to 5.0mol/l.

5. A method according to claims 1, wherein said voltage is not lower than the hydrogen generating potential of said electrolyte solution and no greater than 10.0 V.

6. A method according to claim 2, wherein said voltage is not lower than the hydrogen generating potential of said electrolyte solution and no greater than 10.0 V.

7. A method according to claim 1, wherein the mean value of the current density flowing in said photoelectric conversion device is from 0.1 mA/cm$^2$ to 1 A/cm$^2$.

8. A method according to claim 2, wherein the mean value of the current density flowing in said photoelectric conversion device is from 0.1 mA/cm$^2$ to 1 A/cm$^2$.

9. A method according to claim 3, wherein the mean value of the current density flowing in said photoelectric conversion device is from 0.1 mA/cm$^2$ to 1 A/cm$^2$.

10. A method of removing a short-circuit portion in a photoelectromotive force producing a photoelectric conversion device comprising the steps of:
   (i) forming said photoelectric conversion device on a flexible substrate;
   (ii) forming a semiconductor layer between a lower electrode and an upper electrode, said semiconductor layer generating photoelectric conversion force upon absorption of light;
   (iii) preparing an electrolyte solution and immersing said photoelectromotive device in said electrolyte solution, said electrolyte solution comprising hydrogen ions or hydronium ions or hydrogen ions and hydronium ions and having a specific electric conductivity in the range of 0.001 Scm to 10 S/cm which causes an electrochemical reaction which selectively removes said short circuit portion;
   (iv) immersing a counter electrode across from photoelectric conversion device in said electrolyte solution;
   (v) feeding said flexible substrate onto a means for taking up said substrate; and
   (vi) applying a voltage between said photoelectric conversion device and said counter electrode such that said counter electrode serves an a anode, thereby causing solution of the short-circuit portion into said electrolyte solution.

11. A method according to claim 10, wherein said electrolyte solution contains at least one electrolyte selected form the group consisting of an inorganic acid, an organic acid, an inorganic base, an organic base and a salt of a metal having a standard electrode potential level which is minus relative to the standard hydrogen electrode potential and which has an absolute value greater than hydrogen over voltage.

12. A method according to claim 10, wherein the concentration of the electrolyte in said electrolyte solution is from $2\times10^{-4}$ mol/l to 5.0mol/l.

13. A method according to claim 11, wherein the concentration of the electrolyte in said electrolyte solution is from $2\times10^{-4}$ mol/l to 5.0mol/l.

14. A method according to claim 10, wherein said voltage is not lower than the hydrogen generating potential of said electrolyte solution and no greater than 10.0 V.

15. A method according to claim 11, wherein said voltage is not lower than the hydrogen generating potential of said electrolyte solution and no greater than 10.0 V.

16. A method according to claim 10, wherein the mean value of the current density flowing in said photoelectric conversion device is from 0.1 mA/cm$^2$ to 1 A/cm$^2$.

17. A method according to claim 11, wherein the mean value of the current density flowing in said photoelectric conversion device is from 0.1 Ma/cm$^2$ to 1 A/cm$^2$.

18. A method according to claim 12, wherein the mean value of the current density flowing in said photoelectric conversion device is from 0.1 mA/cm$^2$ to 1 A/cm$^2$.

19. A method according to claim 10, wherein said substrate is fed from a first feed roll and taken up by a second feed roll.

* * * * *

UNITED STATES PATENT AND TRADEMARK OFFICE
CERTIFICATE OF CORRECTION

PATENT NO. : 5,320,723
DATED : June 14, 1994
INVENTOR(S) : SOUICHIRO KAWAKAMI

Page 1 of 4

It is certified that error appears in the above-identified patent and that said Letters Patent is hereby corrected as shown below:

ON TITLE PAGE

In [56] References Cited, under FOREIGN PATENT DOCUMENTS:
"5994473  5/1984  Japan" should read
--59-94473  5/1984  Japan--; and
"6253958  3/1987  Japan" should read
--62-53958  3/1987  Japan--.

In [57] ABSTRACT:
Line 17, "super voltage" should read --overvoltage--.

COLUMN 1

Line 25, "which" should read --which,--.
Line 45, "specification" should read --specifications--.
Line 46, "proposes" should read --propose--.

COLUMN 4

Line 36, "electrodes." should read --electrodes; and--.
Line 57, "lytic" should read --lyte--.
Line 59, "electrolytic" should read --electrolyte--.
Line 65, "Eo" should read --E°--.
Line 67, "$E_H O$" should read --$E_H°$--.

COLUMN 5

Line 16, "potentials" should read --potentials,--.
Line 17, "overvoltage" should read --overvoltage,--.

UNITED STATES PATENT AND TRADEMARK OFFICE
CERTIFICATE OF CORRECTION

PATENT NO. : 5,320,723
DATED : June 14, 1994
INVENTOR(S) : SOUICHIRO KAWAKAMI

It is certified that error appears in the above-identified patent and that said Letters Patent is hereby corrected as shown below:

COLUMN 6

Line 7, "boiling" should be deleted and "1U" should be deleted.
    Line     "pin" should read --pn--.
    Line     "a" should be deleted.

COLUMN 10

Line 4, "short circuit" should read --short-circuit--.

COLUMN 12

Line 13, "and the " should be deleted ("I-V" means current-voltage).

COLUMN 13

Line 43, "lyte" should read --lytic--.
    Line 57, "device was" should read --devices were--.
    Line 66, "device" should read --devices--.

COLUMN 14

Line 1, "was" should read --were--..

COLUMN 15

Line 1, "were" should read --was--.
    Line 14, "SnO2" should read --$SnO_2$--.

UNITED STATES PATENT AND TRADEMARK OFFICE
CERTIFICATE OF CORRECTION

PATENT NO. : 5,320,723
DATED : June 14, 1994
INVENTOR(S) : SOUICHIRO KAWAKAMI

Page 3 of 4

It is certified that error appears in the above-identified patent and that said Letters Patent is hereby corrected as shown below:

COLUMN 16

Line 20, "0.5 s/cm" should read --0.5 S/cm--.
Line 38, "have" should read --had--.
Line 47, "electrode said" should read --electrode, said--.
Line 61, "said" should read --in said--.

COLUMN 17

Line 8, "over voltage" should read --overvoltage--.
Line 15, "claims 1," should read --claim 1,--.
Line 32, "photoelectromotive force" should read
--photoelectric conversion device--; and
"photoelectric" should read --photoelectromotive--.
Line 33, "conversion device" should read --force--.
Line 46, "0.001 Scm" should read --0.001 S/cm--.

COLUMN 18

Line 1, "from" should read --from said--.
Line 8, "serves an" should read --serves as an--; and
"a" should be deleted.
Line 13, "form" should read --from--.
Line 18, "over voltage" should read --overvoltage--.

UNITED STATES PATENT AND TRADEMARK OFFICE
CERTIFICATE OF CORRECTION

PATENT NO. : 5,320,723
DATED : June 14, 1994
INVENTOR(S) : SOUICHIRO KAWAKAMI

It is certified that error appears in the above-identified patent and that said Letters Patent is hereby corrected as shown below:

<u>COLUMN 18</u>

Line 39, "0.1 Ma/cm$^2$" should read --0.1 mA/cm$^2$--.

Signed and Sealed this

Twenty-seventh Day of December, 1994

Attest:

BRUCE LEHMAN

Attesting Officer     *Commissioner of Patents and Trademarks*